United States Patent
Yamagami

(10) Patent No.: US 10,930,340 B2
(45) Date of Patent: Feb. 23, 2021

(54) SEMICONDUCTOR STORAGE CIRCUIT, SEMICONDUCTOR STORAGE APPARATUS, AND DATA DETECTION METHOD

(71) Applicant: SOCIONEXT INC., Kanagawa (JP)

(72) Inventor: Yoshinobu Yamagami, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/657,895

(22) Filed: Oct. 18, 2019

(65) Prior Publication Data

US 2020/0051619 A1  Feb. 13, 2020

Related U.S. Application Data

(63) Continuation of application No. PCT/JP2018/005541, filed on Feb. 16, 2018.

(30) Foreign Application Priority Data

Apr. 20, 2017  (JP) .............................. JP2017-083648

(51) Int. Cl.
   *G11C 11/419*  (2006.01)
   *G11C 11/418*  (2006.01)

(52) U.S. Cl.
   CPC .......... *G11C 11/419* (2013.01); *G11C 11/418* (2013.01)

(58) Field of Classification Search
   CPC ....... G11C 11/419; G11C 11/418; G11C 8/16; G11C 11/412; G11C 7/12; G11C 7/18
   See application file for complete search history.

(56) References Cited

U.S. PATENT DOCUMENTS

| | | | | |
|---|---|---|---|---|
| 2002/0031007 A1* | 3/2002 | Osada | ..................... | G11C 7/065 365/156 |
| 2003/0016579 A1* | 1/2003 | Desai | ....................... | G11C 7/12 365/203 |
| 2008/0112234 A1* | 5/2008 | Tokito | ..................... | G11C 7/12 365/189.16 |
| 2008/0151653 A1 | 6/2008 | Ishikura et al. | | |

(Continued)

FOREIGN PATENT DOCUMENTS

| JP | 2008-176910 A | 7/2008 |
|---|---|---|
| JP | 2010-198724 A | 9/2010 |

OTHER PUBLICATIONS

H. Noguchi et al., "Which is the Best Dual-Port SRAM in 45-nm Process Technology?—8T, 10T Single End, and 10T Differential-," Proc. International Conference on IC Design and Technology, Jun. 2008, pp. 55-58.

(Continued)

*Primary Examiner* — Khamdan N. Alrobaie
(74) *Attorney, Agent, or Firm* — McDermott Will & Emery LLP

(57) ABSTRACT

A semiconductor storage circuit has: a plurality of first memory cells and a first precharge transistor connected to a first local read bit line; and a plurality of second memory cells and a second precharge transistor connected to a second local read bit line. A signal responsive to signals output to the first and second local read bit lines is output to a global read bit line via a gate circuit and an output circuit. A first transistor having a gate connected to the output of the gate circuit is provided between the first and second local read bit lines.

10 Claims, 10 Drawing Sheets

(56) References Cited

U.S. PATENT DOCUMENTS

| | | |
|---|---|---|
| 2009/0175099 A1* | 7/2009 | Tao .................. G11C 7/12 |
| | | 365/189.15 |
| 2009/0175107 A1 | 7/2009 | Christensen et al. |
| 2009/0251974 A1 | 10/2009 | Chu et al. |
| 2010/0214860 A1 | 8/2010 | Upputuri |
| 2011/0280095 A1 | 11/2011 | Lum et al. |
| 2013/0044556 A1 | 2/2013 | Upputuri |
| 2014/0071730 A1* | 3/2014 | Terada ................ G11C 5/063 |
| | | 365/72 |
| 2014/0185369 A1 | 7/2014 | Upputuri |
| 2015/0162076 A1* | 6/2015 | Wang ................ G11C 7/1048 |
| | | 365/154 |
| 2016/0118107 A1 | 4/2016 | Upputuri |
| 2017/0076786 A1 | 3/2017 | Upputuri |
| 2017/0316821 A1 | 11/2017 | Upputuri |

OTHER PUBLICATIONS

International Search Report issued in corresponding PCT/JP2018/005541, dated May 1, 2018, with English translation.
Written Opinion issued in corresponding PCT/JP2018/005541, dated May 1, 2018, with English translation.

* cited by examiner

"H" DATA READ

"L" DATA READ

SEMICONDUCTOR STORAGE CIRCUIT, SEMICONDUCTOR STORAGE APPARATUS, AND DATA DETECTION METHOD

CROSS-REFERENCE TO RELATED APPLICATIONS

This is a continuation of International Application No. PCT/JP2018/005541 filed on Feb. 16, 2018, which claims priority to Japanese Patent Application No. 2017-083648 filed on Apr. 20, 2017. The entire disclosures of these applications are incorporated by reference herein.

BACKGROUND

The present disclosure relates to a semiconductor storage circuit having a hierarchical bit line structure and a semiconductor storage apparatus having such a semiconductor storage circuit.

A semiconductor storage apparatus having a hierarchical bit line structure is known for speeding up the read rate of the semiconductor storage apparatus. For example, Japanese Unexamined Patent Publication No. 2008-176910 (Patent Document 1) shows in FIG. 7 an example in which paired memory cell groups are connected to a global read bit line via a local amplifier. In this example, the high-level ("H") read accuracy of a local read bit line may be worsened due to a leak current of a read access transistor of a nonselected memory cell constituting the memory cell groups and a leak current of a read drive transistor of a selected memory cell.

As a solution of the problem of the read accuracy described above, a configuration of providing a high-level latch type bit line keeper for a read bit line is disclosed in Hiroki Noguchi et al., "Which is the Best Dual-Port SRAM in 45-nm Process Technology?—8T, 10T Single End, and 10T Differential —," Proc. International Conference on IC Design and Technology, pp. 55-58, June 2008 (Non-Patent Document 1). The bit line keeper is configured to hold a local read bit line at "H" at the time of "H" read of the local read bit line. With this, the "H" read of the local read bit line can be kept from being affected by the leak currents described above. Therefore, one bit line keeper is inserted for each of all local read bit lines.

SUMMARY

In the bit line keeper described above, the driving capability of a transistor provided between the power supply and a local read bit line is desirably set to a low value within the bounds of satisfying the driving capability (current supply capability) required for compensation of the leak currents from the standpoint of shortening the read time. To reduce the driving capability of a transistor, one method is increasing the gate length of the transistor if the gate width thereof cannot be reduced. Another method is connecting a plurality of transistors having similar sizes in series.

The above measures of reducing the driving capability of a transistor must be performed for all bit line keepers (of the number corresponding to the number of local read bit lines), which causes a problem of significantly increasing the circuit area. This is especially a noticeable problem for the microfabrication process and transistors having a three-dimensional structure (e.g., fin FETs and nanowire FETs) in which the area will increase when transistors different in gate size from other transistors are placed due to constraints of the layout, etc.

An objective of the present disclosure is implementing a semiconductor storage circuit that has a hierarchical bit line structure and is provided with the function of a bit line keeper with a reduced area.

According to one form of the present disclosure, a semiconductor storage circuit includes a first local block including a plurality of first memory cells connected to a first local read bit line and a first precharge transistor of a first conductivity type connected between the first local read bit line and a first power supply; a second local block including a plurality of second memory cells connected to a second local read bit line and a second precharge transistor of the first conductivity type connected between the second local read bit line and the first power supply; a gate circuit configured to output a signal responsive to signals output to the first local read bit line and the second local read bit line; an output circuit configured to output a signal responsive to the output of the gate circuit to a global read bit line; and a first transistor of the first conductivity type provided between the first local read bit line and the second local read bit line, a gate of the first transistor being connected to the output of the gate circuit, wherein when the first precharge transistor is turned off and the first transistor is turned on, the first local read bit line is held at the level of the first power supply through only a conduction path formed of a series circuit of the second precharge transistor and the first transistor.

According to the above form, in the read of data in the first local block, high-level latch operation for the first local read bit line is achieved with a circuit through the first transistor and the second precharge transistor. Likewise, in the read of data in the second local block, high-level latch operation is achieved with a circuit through the first transistor and the first precharge transistor. That is, in this form, the first transistor can be shared in the high-level latch operation for the first local block and the second local block. Moreover, the precharge transistors conventionally provided in a semiconductor storage circuit having a hierarchical bit line structure can be used for the high-level latch operation. This can reduce the size of the first transistor.

As described in Non-Patent Document 1, in the case of using a single transistor to achieve the high-level latch operation in a bit line keeper, the following problem arises as described above: since the gate length of the transistor must be increased from the standpoint of setting a low driving capability while satisfying the driving capability required for compensation of a leak current, the occupancy area of the transistor will be large.

In contrast to the above, in this form, the first transistor is shared in the high-level latch operation for the first local read bit line and the second local read bit line, and the precharge transistors can be used as transistors serially connected to the first transistor. With this, while the driving capability is reduced, the area of the circuit related to the high-level latch operation can be reduced, compared to the conventional art.

According to the present disclosure, a semiconductor storage circuit that has a hierarchical bit line structure and is provided with the function of a bit line keeper can be implemented with a reduced area.

DETAILED DESCRIPTION

Embodiments of the present disclosure will be described hereinafter with reference to the accompanying drawings.

First Embodiment

Figure 1:
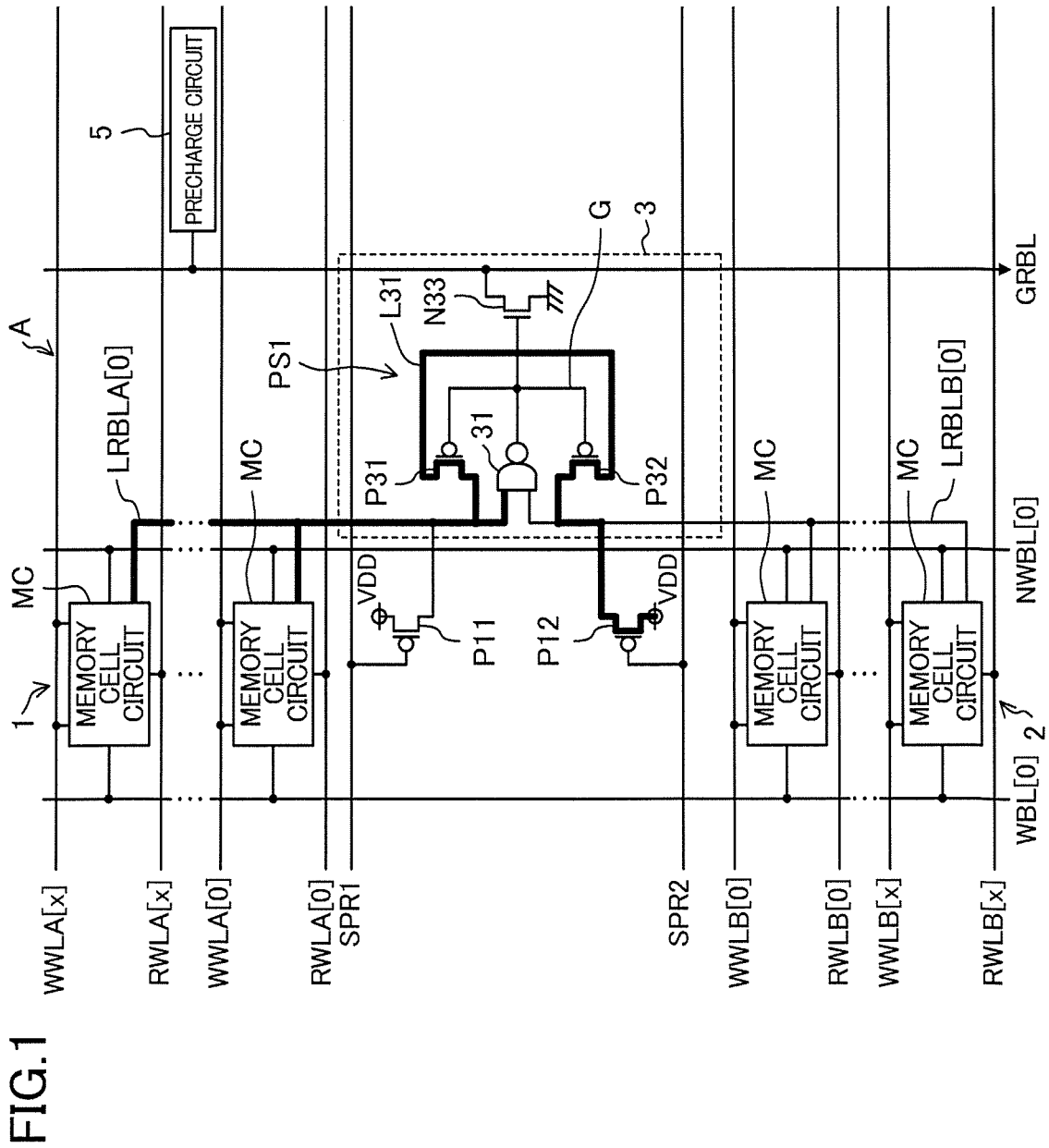
FIG. 1 is a view showing a configuration of a semiconductor storage circuit according to the first embodiment.

FIG. 1 is a view showing a circuit configuration of a semiconductor storage circuit A (main part of a semiconductor storage apparatus) according to the first embodiment. Although specific illustration is omitted, the semiconductor storage apparatus has a configuration in which a plurality of semiconductor storage circuits A as one shown in FIG. 1 are arranged in the column direction and/or the row direction, for example. Also, although illustration is omitted, the semiconductor storage apparatus has drive circuits, read circuits, and controllers connected to write word lines WWLA[0] to [x] (x is an arbitrary positive integer) and WWLB[0] to [x], read word lines RWLA[0] to [x] and RWLB[0] to [x], a pair of write bit lines WBL[0] and NWBL[0], and a global read bit line GRBL.

=Configuration of Semiconductor Storage Circuit=

The semiconductor storage circuit A shown in FIG. 1 has a first local block 1, a second local block 2, and a read local amplifier 3.

The first local block 1 has a plurality of memory cells MC as the first memory cells connected to a first local read bit line (hereinafter abbreviated as a first local bit line) LRBLA[0] and a first precharge transistor P11 of the p-type as the first conductivity type connected between the power supply VDD and the first local bit line LRBLA[0].

A first precharge signal SPR1 is fed to the gate of the first precharge transistor P11. The first precharge signal SPR1, which is a signal for controlling precharge of the first local bit line LRBLA[0], turns on the first precharge transistor P11 at the time of precharge of the first local bit line LRBLA[0], to allow precharge of the first local bit line LRBLA[0]. The first precharge signal SPR1 turns off the first precharge transistor P11 at the time of read of data from the memory cells MC in the first local block 1, to clear the precharge of the first local bit line LRBLA[0].

The second local block 2 has a plurality of memory cells MC as the second memory cells connected to a second local read bit line (hereinafter abbreviated as a second local bit line) LRBLB[0] and a second precharge transistor P12 of the p-type connected between the power supply VDD and the second local bit line LRBLB[0].

A second precharge signal SPR2 is fed to the gate of the second precharge transistor P12. The second precharge signal SPR2, which is a signal for controlling precharge of the second local bit line LRBLB[0], turns on the second precharge transistor P12 at the time of precharge of the second local bit line LRBLB[0], to allow precharge of the second local bit line LRBLB[0]. The second precharge signal SPR2 turns off the second precharge transistor P12 at the time of read of data from the memory cells MC in the second local block 2, to clear the precharge of the second local bit line LRBLB[0].

The first local block 1 and the second local block 2 are connected to the global read bit line (hereinafter abbreviated as the global bit line) GRBL via the read local amplifier 3.

The read local amplifier 3 is constituted by a NAND circuit 31 as the gate circuit, an n-type output transistor N33 as the output circuit, and p-type transistors P31 and P32 as the first transistor. The transistors P31 and P32 are connected in series between the first local bit line LRBLA[0] and the second local bit line LRBLB[0] via a first node L31. An output signal G of the NAND circuit 31 is fed to the gates of the transistors P31 and P32. The transistors P31 and P32 are set to have sizes with which a leak current of a read drive transistor N45 (see FIG. 2) to be described later can be compensated in the state where the transistors P31 and P32 and either one of the first precharge transistor P11 and the second precharge transistor P12 are conducting and also no rate delay related to read operation of "L" data to be described later will occur. In other words, the sizes of the transistors P31 and P32 are set to have the driving capability required for compensating the leak current of the read drive transistor N45: i.e., the driving capability is set to be low within the bounds of permitting compensation of the leak current.

The gate circuit outputs a signal responsive to signals output to the first local bit line LRBLA[0] and the second local bit line LRBLB[0]. Specifically, the gate circuit is configured to change its output when either one of the first local bit line LRBLA[0] and the second local bit line LRBLB[0] has changed from the precharge state. FIG. 1 shows the example of using the 2-input NAND circuit 31 as the gate circuit, in which the first local bit line LRBLA[0] is connected to one input terminal and the second local bit line LRBLB[0] is connected to the other input terminal. The output signal G of the NAND circuit 31 is connected to the gate of the output transistor N33 and the gates of the transistors P31 and P32. The gate circuit may be implemented by a gate circuit other than the NAND circuit 31 or a combined circuit.

The output circuit outputs a signal responsive to the output of the gate circuit (NAND circuit 31) to the global bit line GRBL. FIG. 1 shows the example of using the n-type output transistor N33 as the output circuit. The output transistor N33 is connected between the global bit line GRBL and the ground VSS.

—Configuration of Memory Cell—

Figure 2:
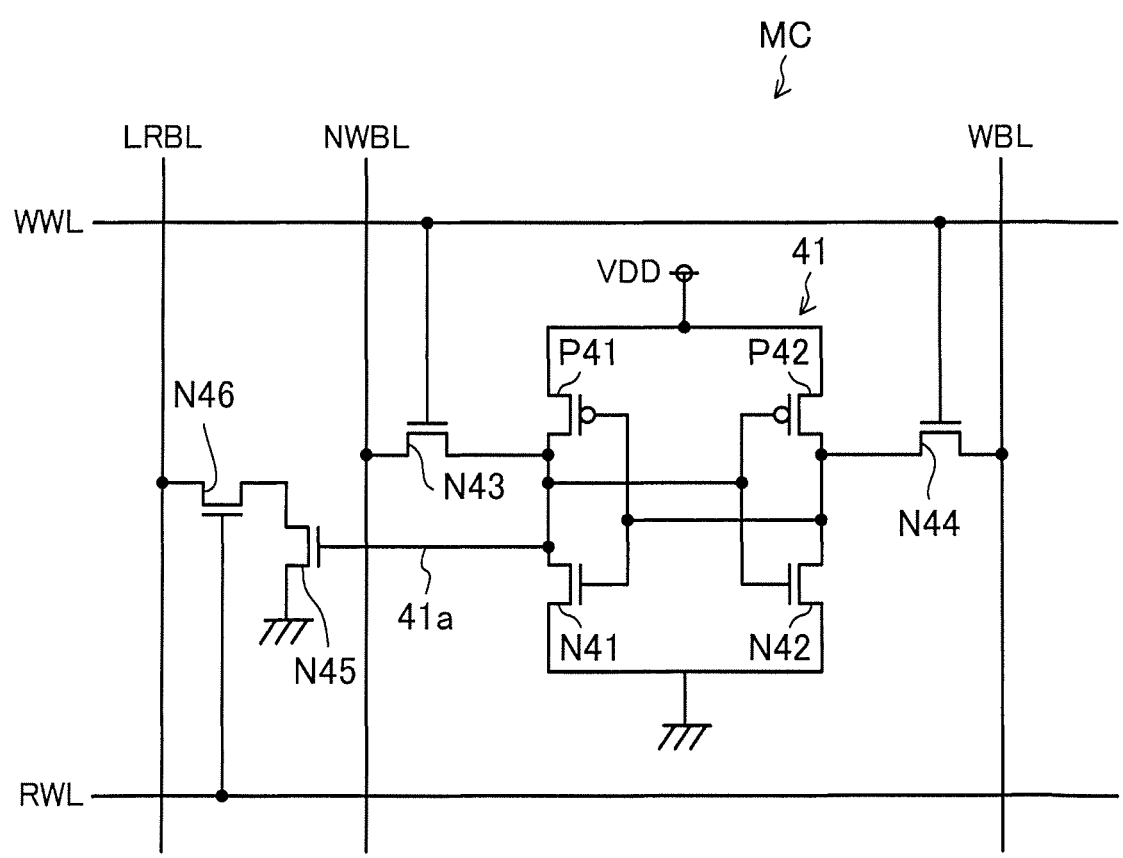
FIG. 2 is a view showing a configuration of a memory cell.

FIG. 2 is a view showing a configuration of the memory cell MC. As shown in FIG. 2, the memory cell MC is connected to a write word line WWL (corresponding to WWLA[0] to [x] and WWLB[0] to [x] in FIG. 1), a read word line RWL (corresponding to RWLA[0] to [x] and RWLB[0] to [x] in FIG. 1), a pair of write bit lines WBL and NWBL (corresponding to WBL[0] and NWBL[0] in FIG. 1), and a local bit line LRBL (corresponding to LRBLA[0] and LRBLB[0] in FIG. 1), and constitutes a dual-port (DP) static random access memory (SRAM) cell.

The memory cell MC is constituted by a holding circuit 41 formed of four transistors P41, P42, N41, and N42, a pair of write access transistors N43 and N44, a read drive transistor N45, and a read access transistor N46. The holding circuit 41 includes an inverter circuit made of the p-type transistor P41 and the n-type transistor N41 and an inverter circuit made of the p-type transistor P42 and the n-type transistor N42, in which the inputs/outputs of these inverter circuits are mutually connected. The pair of write access transistors N43 and N44, the read drive transistor N45, and the read access transistor N46 are all n-type transistors.

The write access transistors N43 and N44 are connected between the write bit lines WBL and NWBL and the holding circuit 41, and serve as access gates (transfer gates) that allow conduction of the write bit lines WBL and NWBL to the holding circuit 41 when the write word line WWL becomes "H" (high level).

The read drive transistor N45 and the read access transistor N46 are connected in series between the local bit line LRBL and the ground VSS. The gate of the read drive transistor N45 is connected to an input/output node 41a of the holding circuit 41, and the gate of the read access transistor N46 is connected to the read word line RWL. Thus, the local bit line LRBL is to become "L" (low level) when the read word line RWL and the input/output node 41a of the holding circuit 41 become "H."

Returning to FIG. 1, the precharge circuit 5 is connected to the global bit line GRBL. The precharge circuit 5 allows or clears precharge of the global bit line GRBL in accordance with the first and second precharge signals SPR1 and SPR2. Specifically, the precharge circuit 5 operates to clear the precharge of the global bit line GRBL at the time of read of data from the memory cells MC in the first local block 1 or the memory cells MC in the second local block 2.

=Operation of Semiconductor Storage Circuit=

The operation of the semiconductor storage circuit A will be described with reference to the relevant drawings.

Figure 3:
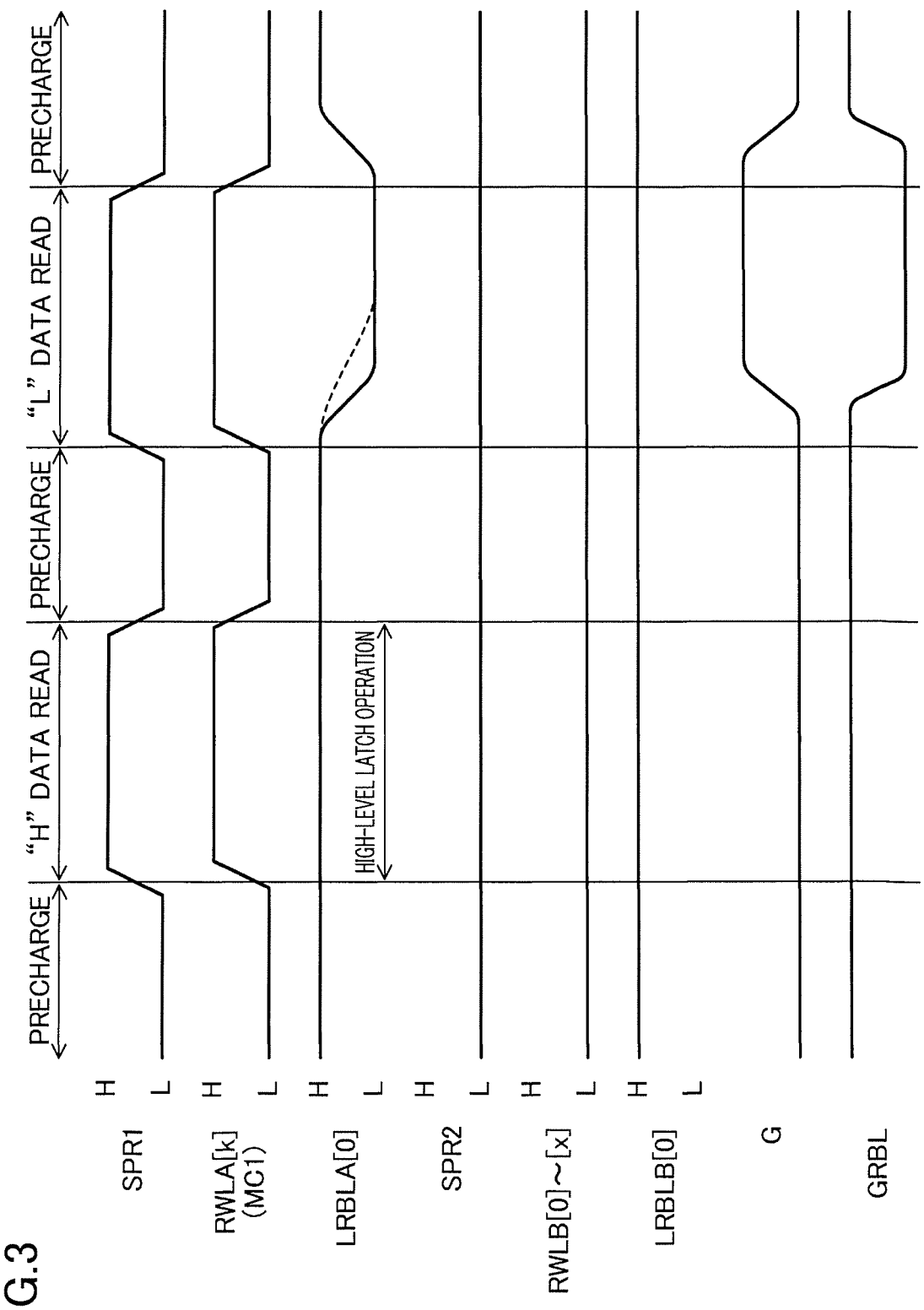
FIG. 3 is a timing chart showing read operation of the semiconductor storage circuit.

FIG. 3 is a timing chart showing the read operation of the semiconductor storage circuit A. First, the operation followed when data is read from a memory cell MC as an object to be read (hereinafter referred to as a first memory cell MC1) that is a constituent of the first local block 1 will be described.

Note that, in the state where neither the first local block 1 nor the second local block 2 is being read (this state is hereinafter referred to as the non-read state), both the first and second precharge signals SPR1 and SPR2 are "L", and both the first and second local bit lines LRBLA[0] and LRBLB[0] are being precharged to "H." Likewise, the global bit line GRBL is being precharged to "H" by the precharge circuit 5. In this non-read state, since "H" is input into both input terminals of the NAND circuit 31, the output signal G is "L," whereby both the transistors P31 and P32 are on, allowing conduction between the first local bit line LRBLA[0] and the second local bit line LRBLB[0].

—Read of "H" Data (First Local Block)—

Read of "H" data from the first memory cell MC1, i.e., read in the case when "L" data is being output from the input/output node 41a of the holding circuit 41 included in the first memory cell MC1 will be described.

First, the "H" first precharge signal SPR1 is fed to the first precharge transistor P11, which clears the precharge of the first local bit line LRBLA[0]. At the same time, the precharge of the global bit line GRBL is cleared. At this time, the second precharge signal SPR2 remains "L," whereby the second local bit line LRBLB[0] is kept precharged to "H." Thereafter, or roughly simultaneously, the read word line RWLA[k] (k is an address of the memory cell MC1 in the row direction, and an integer satisfying 0≤k≤x) connected to the first memory cell MC1 is driven to "H," turning on the read access transistor N46. On the other hand, since the input/output node 41a of the holding circuit 41a is "L," the read drive transistor N45 is off.

As already described, the transistors P31 and P32 are on, allowing conduction between the first local bit line LRBLA[0] and the second local bit line LRBLB[0].

Also, since the second precharge transistor P12 is on, a circuit from the power supply VDD through the second precharge transistor P12 and the transistors P32 and P31 (this circuit is hereinafter referred to as a first connection route PS1; see the bold line in FIG. 1) is in conduction. With this circuit, the first local bit line LRBLA[0] is held at "H," achieving high-level latch operation as a bit line keeper. Therefore, even if a leak current happens to flow through the read drive transistor N45, the first local bit line LRBLA[0] will be held at "H." With this, the output transistor N33 is kept off, allowing "H" data to be read to the global bit line GRBL.

After the read of "H" data to the global bit line GRBL, the read word line RWLA[k] connected to the first memory cell MC1 and the first precharge signal SPR1 return to "L." With this, the first local bit line LRBLA[0] is precharged to "H" again via the first precharge transistor P11, and the state returns to the non-read state.

—Read of "L" Data (First Local Block)—

Read of "L" data from the first memory cell MC1, i.e., read in the case when "H" data is being output from the input/output node 41a of the holding circuit 41 included in the first memory cell MC1 will be described. Note that the operations of (1) clearing the precharge of the first local bit line LRBLA[0] and the global bit line GRBL, (2) precharging the second local bit line LRBLB[0] to "H," and (3) turning on the read access transistor N46 are similar to those in the read of "H" data described above, and thus detailed description thereof is omitted here.

In the read of "L" data, since the input/output node 41a of the holding circuit 41 of the first memory cell MC1 is "H," the read drive transistor N45 is on as is the read access transistor N46, whereby the first local bit line LRBLA[0] is driven to "L." Since the driving capability of the transistors P31 and P32 is set to be low as described above, the output signal G of the NAND circuit 31 changes from "L" to "H." This turns off the transistors P31 and P32, shutting off the connection between the first local bit line LRBLA[0] and the second local bit line LRBLB[0] (the first connection route PS1). Also, the output transistor N33 is turned on, whereby "L" data is read to the global bit line GRBL. In this way, in the "L" data read, the operation of keeping the first connection route PS1 from hampering the "L" data read is achieved. Note that in FIG. 3 an example of the waveform of the first local bit line LRBLA[0] in the case where the driving capability of the transistors P31 and P32 is not set to be sufficiently low is shown by the dashed line. In such a case, the change of the LRBLA[0] is slow, whereby the change of the output signal G is also slow, causing reduction of the read rate to the global read bit line GRBL in some cases.

—Read Operation of Second Local Block—

Next, the operation followed when data is read from a memory cell MC as an object to be read (hereinafter referred to as a second memory cell MC2) that is a constituent of the second local block 2 will be described. Note that the basic operations in the read of "H" data and "L" data from the second memory cell MC2 are similar to those in the case of the first memory cell MC1 although the functioning constituents may differ. Therefore, description here will be made focusing on points different from the data read operations from the first memory cell MC1.

First, the "H" second precharge signal SPR2 is fed to the second precharge transistor P12, which clears the precharge of the second local bit line LRBLB[0]. At the same time, the precharge of the global bit line GRBL is cleared.

On the other hand, the first precharge signal SPR1 remains "L," whereby the first local bit line LRBLA[0] is kept precharged to "H." Thereafter, or roughly simultaneously, the read word line RWLB[m] (m is an address of the memory cell MC2 in the row direction, and an integer satisfying 0≤m≤x) connected to the second memory cell MC2 is driven to "H," and data from the holding circuit 41 of the second memory cell MC2 is read to the second local bit line LRBLB[0].

Figure 4:
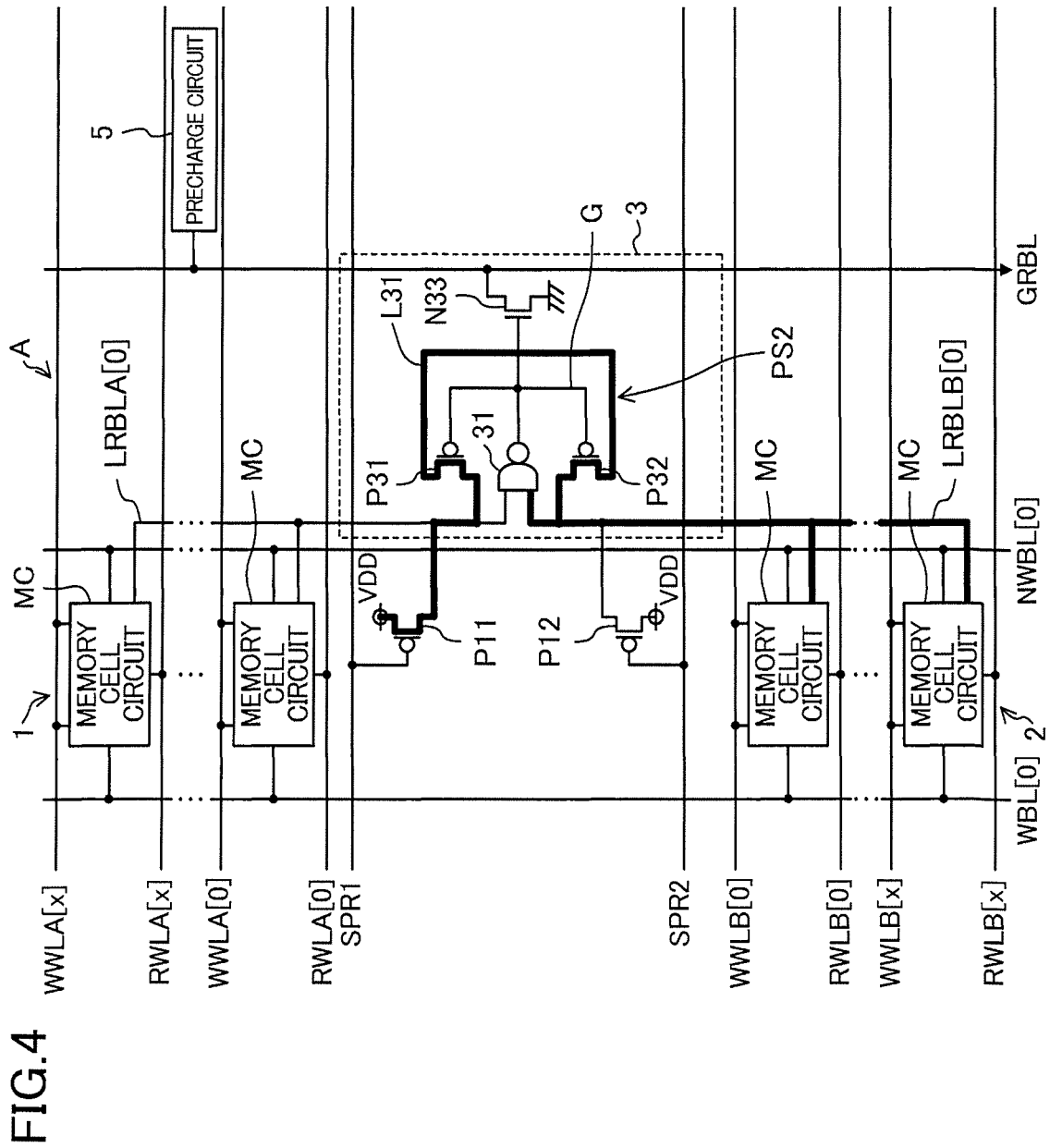
FIG. 4 is a circuit configuration diagram for explaining read operation for a second local block.

In the read of "H" data, since the transistors P31 and P32 and the first precharge transistor P11 are on, a circuit from the power supply VDD through the first precharge transistor P11 and the transistors P31 and P32 (hereinafter referred to as a second connection route PS2; see the bold line in FIG. 4) is in conduction. With this circuit, the second local bit line LRBLB[0] is held at "H", achieving high-level latch operation as a bit line keeper. Therefore, even if a leak current happens to flow through the read drive transistor N45, the second local bit line LRBLB[0] will be held at "H." With this, the output transistor N33 is kept off, allowing "H" data to be read to the global bit line GRBL.

In the read of "L" data, when the second local bit line LRBLB[0] is driven to "L," the output signal G of the NAND circuit 31 changes from "L" to "H" since the driving capability of the transistors P31 and P32 is set to be low as described above. This turns off the transistors P31 and P32, shutting off the connection between the first local bit line LRBLA[0] and the second local bit line LRBLB[0] (the second connection route PS2). Also, the output transistor N33 is turned on, whereby "L" data is read to the global bit line GRBL.

As described above, according to this embodiment, at the time of data read from the first local bit line LRBLA[0], the high-level latch operation of the first local bit line LRBLA[0] is achieved with the transistors P31, P32, and P12 placed in the first connection route PS1. Similarly, at the time of data read from the second local bit line LRBLB[0], the high-level latch operation is achieved with the transistors P31, P32, and P11 placed in the second connection route PS2.

When a single transistor is used for achieving the high-level latch operation in the bit line keeper as described in Non-Patent Document 1, it is necessary to increase the gate length of the transistor from the standpoint of setting a low driving capability while satisfying the driving capability required for compensation of a leak current as described above. This causes a problem that the occupancy area of the transistor for achieving the function of the bit line keeper will become large.

Figure 5:
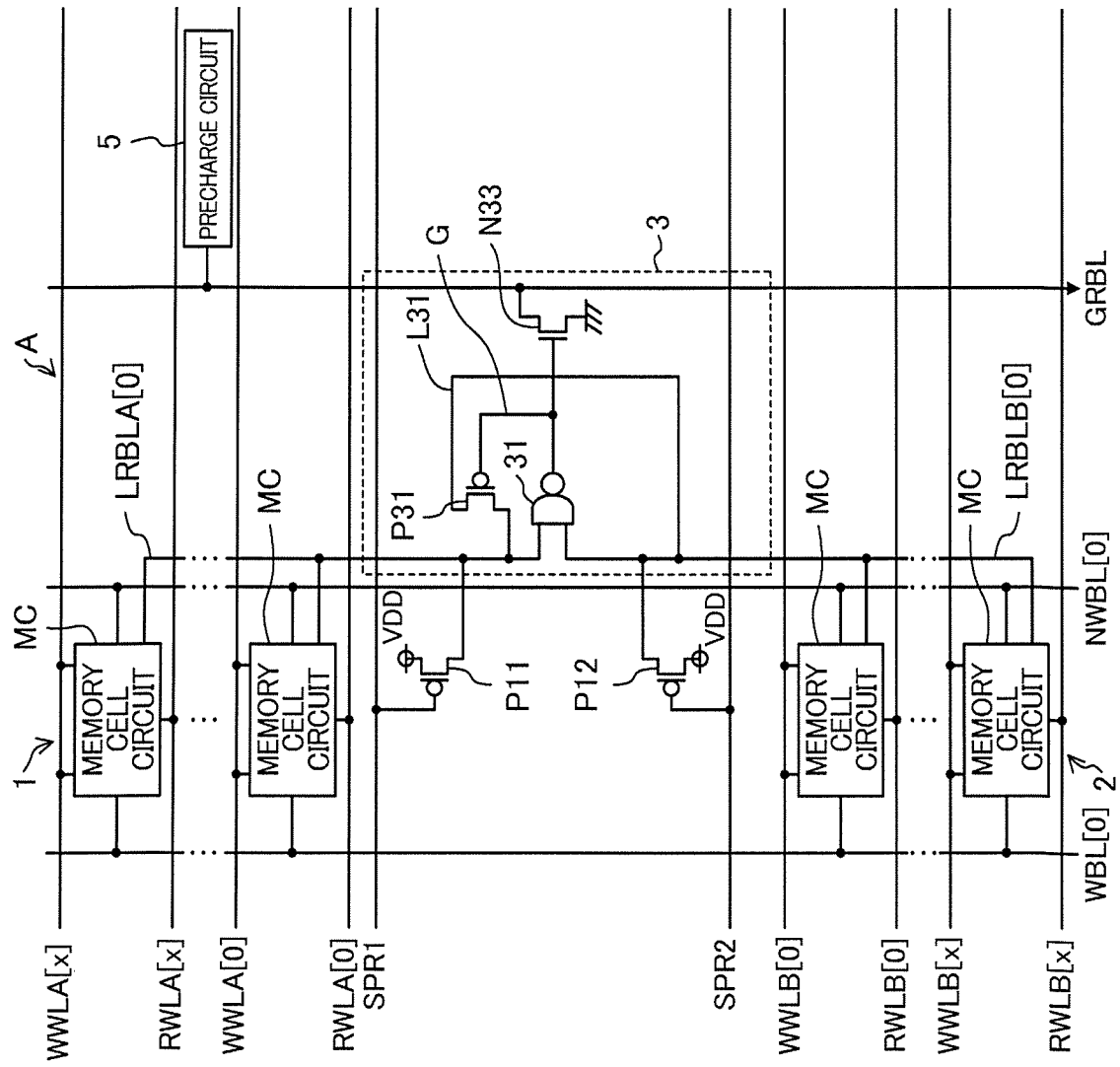
FIG. 5 is a view showing another example of the circuit configuration of the semiconductor storage circuit according to the first embodiment.

In contrast to the above, in this embodiment, the serially-connected transistors P31 and P32 are used for the high-level latch operation of the first local bit line LRBLA[0] and the second local bit line LRBLB[0]. Since the transistors P31 and P32 are serially connected, it is unnecessary to increase the occupancy areas of the transistors P31 and P32 for the purpose of reducing the driving capability, unlike the conventional art (e.g., one described in Non-Patent Document 1). Moreover, in the high-level latch operation described above, the precharge transistors P11 and P12 provided in the semiconductor storage circuit A can be used as transistors serially connected to the transistors P31 and P32. In this way, while the driving capability is reduced, the occupancy areas of the transistors P31 and P32 can be further reduced compared to the conventional art. Alternatively, if the driving capability is sufficiently low only with either one of the transistors P31 and P32 and the precharge transistors P11 and P12, one of the transistors P31 and P32 can be omitted as shown in FIG. 5. In FIG. 5, an example of omitting the transistor P32, out of the transistors P31 and P32, is shown.

Furthermore, since the transistors P31 and P32 are shared in the high-level latch operation of the first and second local bit lines LRBLA[0] and LRBLB[0], the circuit area of the read local amplifier 3 can be widely reduced compared to the case of inserting one bit line keeper for each line. Specifically, compared to the conventional art, the circuit area around the read local amplifier 3 can be reduced by about several tens of percent.

Other Configuration Examples of Semiconductor Storage Circuit (Read Local Amplifier)

Figure 6:
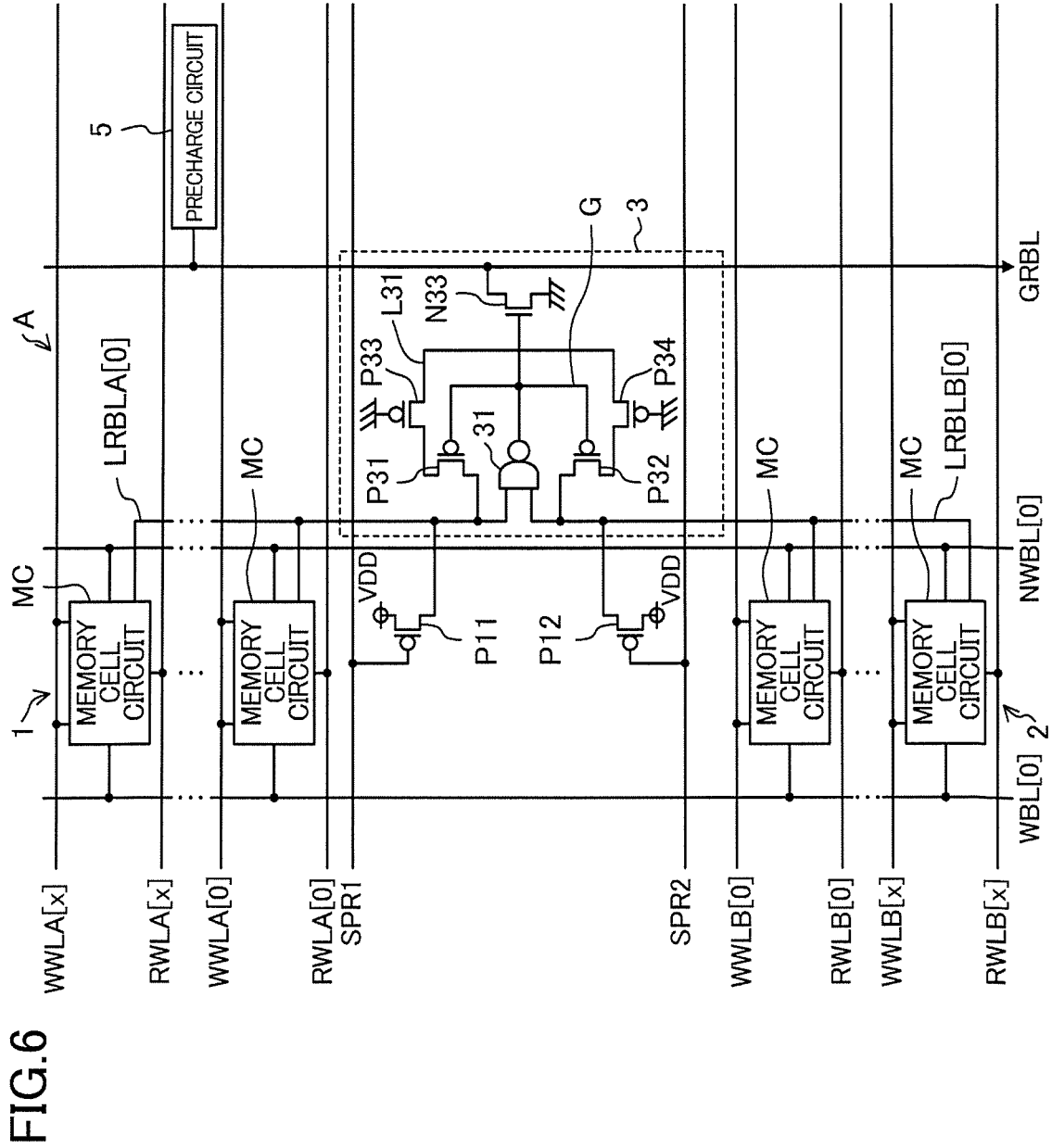
FIG. 6 is a view showing yet another example of the circuit configuration of the semiconductor storage circuit according to the first embodiment.

FIG. 6 is a view showing another configuration example of the semiconductor storage circuit according to the first embodiment.

In the semiconductor storage circuit of FIG. 6, the read local amplifier 3 includes p-type transistors P33 and P34 as the second transistor serially connected between the transistors P31 and P32. The transistors P33 and P34 are connected to the ground VSS at their gates and thus are on at all times. The transistors P33 and P34 have a function of reducing the driving capability of the circuit in the first connection route PS1 or the second connection route PS2. With this, compared to the configuration of FIG. 1, the occupancy areas of the transistors P31 and P32 can be reduced. For example, in the microfabrication process, when a transistor large in gate length compared to other transistors is placed, further area increase tends to be necessary due to constraints of the layout, etc., in addition to the increase in the occupancy area of the transistor due to the large gate length. This tendency is especially noticeable in a transistor having a three-dimensional structure such as a fin FET and a nanowire FET. In such a case, by serially connecting a plurality of transistors (two transistors P33 and P34 in FIG. 5) between the transistors P31 and P32, these transistors P31 to P34 can be made to have a size according to other transistors (e.g., the same gate length).

Moreover, the transistors P33 and P34, like the transistors P31 and P32, are configured to be able to function in both the bit line keeper for the first local block 1 and the bit line keeper for the second local block 2. With this, compared to the case of preparing a bit line keeper for each of the local blocks 1 and 2, the circuit area can be reduced. Since the number of local blocks is huge in the semiconductor storage apparatus (semiconductor storage circuit), significant area reduction is possible by the sharing of the transistors.

Note that, in this configuration, the number of transistors serially connected between the transistors P31 and P32 is not limited to two. For example, either one of the transistors P33 and P34 may be provided, or three or more transistors may be connected in series. Also, the positions of the transistors P33 and P34 are not limited to somewhere between the transistors P31 and P32. For example, the transistor P33 may be connected between the local bit line LRBLA[0] and the transistor P31, and/or the transistor P34 may be connected between the local bit line LRBLB[0] and the transistor P32. In the case of the serial connection of transistors between the transistors P31 and P32, part of the serially connected transistors may be connected in parallel, forming a series-parallel circuit. The number of such transistors connected in series or in series-parallel is determined so that the gate length can be made uniform with other transistors.

Figure 7:
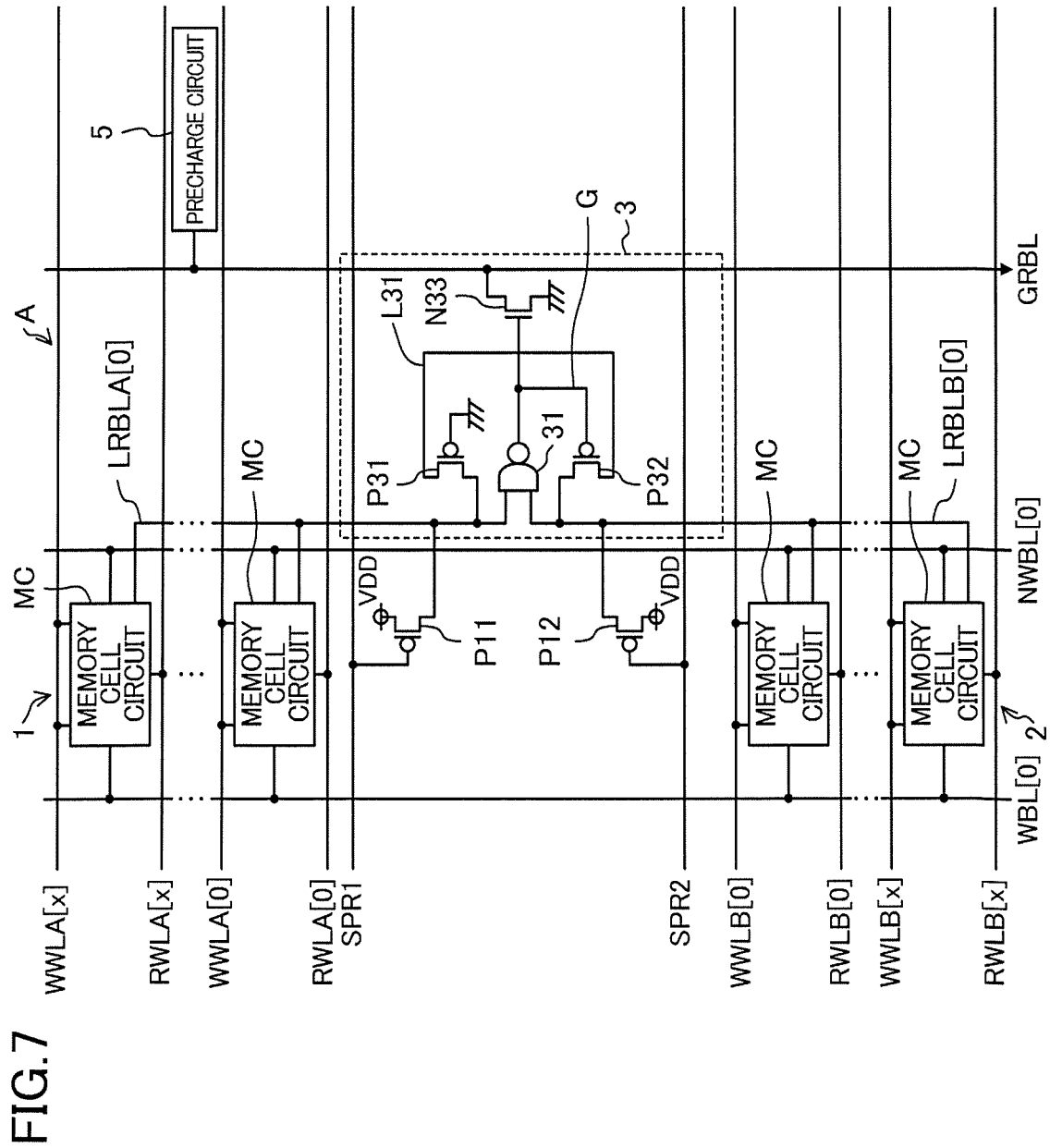
FIG. 7 is a view showing yet another example of the circuit configuration of the semiconductor storage circuit according to the first embodiment.

Also, as shown in FIG. 7, the gate of one of the p-type transistors P31 and P32 (the transistor P31 in FIG. 7) of the read local amplifier 3 may be connected to the ground VSS in place of the output signal G of the NAND circuit 31. In this case, the transistor P31 is on at all times. In this case, also, the transistors P31 and P32 have the function of reducing the driving capability of the circuit in the first connection route PS1 or the second connection route PS2, and thus an advantage similar to that in the configuration of FIG. 1 can be obtained.

Second Embodiment

=Configuration of Semiconductor Storage Circuit=

Figure 8:
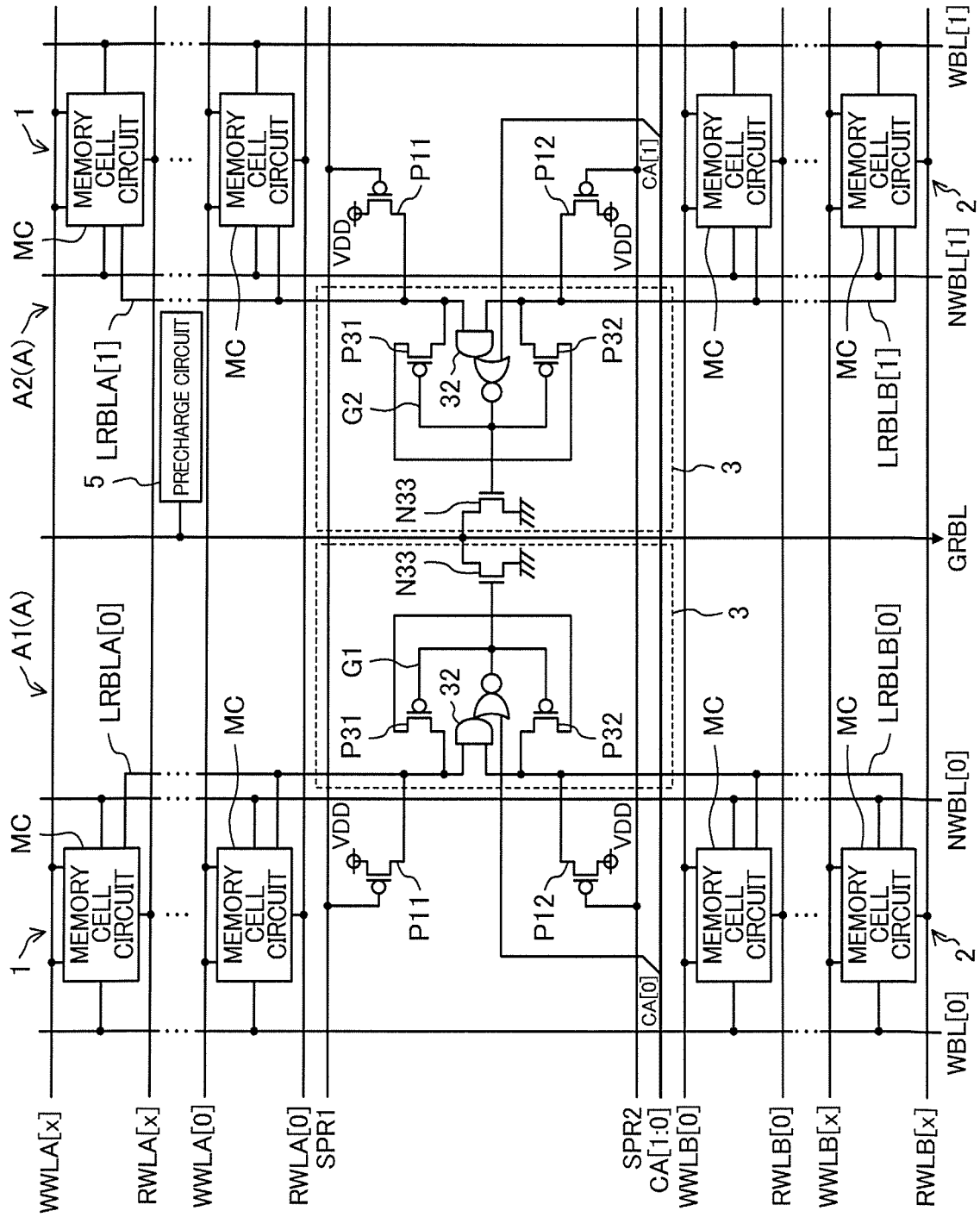
FIG. 8 is a view showing a configuration of a semiconductor storage circuit according to the second embodiment.

FIG. 8 is a view showing a configuration example of a main part of a semiconductor storage apparatus according to the second embodiment. In this embodiment, a case where a plurality of semiconductor storage circuits A are connected to the global bit line GRBL will be described. Specifically, shown in FIG. 8 is an example where two semiconductor storage circuits A arranged side by side in the column direction are connected to the global bit line GRBL. The two semiconductor storage circuits A are substantially the same in circuit configuration, although in some portions signals at their connection destinations are different from each other. In FIG. 8, G1 denotes the output signal of a composite gate circuit 32 of the semiconductor storage circuit A on the left as viewed from the figure. Similarly, G2 denotes the output signal of a composite gate circuit 32 of the semiconductor storage circuit A on the right as viewed from the figure. These also apply to FIG. 9.

Although specific illustration is omitted, the semiconductor storage apparatus has a configuration in which a plurality of semiconductor storage circuits A as one shown in FIG. 1 are arranged in the column direction and/or the row direction, and semiconductor storage circuits A of at least part of the apparatus are connected to the global bit line GRBL via the read local amplifiers 3. Also, the semiconductor storage apparatus and the semiconductor storage circuits A according to this embodiment have constituents in common with the first embodiment. Description will therefore be made focusing on different points, omitting description on common portions with the first embodiment in some cases. For example, the semiconductor storage circuit A includes the first local block 1 and the second local block 2 having a common configuration with the first embodiment and the read local amplifier 3 including a configuration different from the first embodiment.

In each of the semiconductor storage circuits A in FIG. 8, the read local amplifier 3 is constituted by the composite gate circuit 32 as the gate circuit, the output transistor N33 as the output circuit, and the p-type transistors P31 and P32 as the first transistor.

In addition to the first local bit line LRBLA[0] and the second local bit line LRBLB[0], a column address signal CA[1:0] is input into the composite gate circuit 32. When the corresponding column address signal CA[1:0] is active, the composite gate circuit 32 outputs a signal responsive to the signals output to the first local bit line LRBLA[0] and the second local bit line LRBLB[0]. Specifically, when the corresponding column address signal CA[1:0] is active, the composite gate circuit 32 changes its output at the time when either one of the first local bit line LRBLA[0] and the second local bit line LRBLB[0] has changed from the precharge state. Note that FIG. 8 shows a circuit configuration example where, when the column address signal CA[1:0] is "L," the corresponding semiconductor storage circuit A becomes active.

The number of columns is not limited to 2, but with a different number of columns such as 4, 8, or 16 columns, a similar configuration can also be implemented. Specifically, the column address signal CA having the number of bits corresponding to the number of columns may be fed to the composite gate circuits 32 of the semiconductor storage circuits A.

=Operation of Semiconductor Storage Circuit=

In this embodiment, the basic operations at the read of "H" data and "L" data are similar to those in the first embodiment. Therefore, description will be made here focusing on different points from the data read operation in the first embodiment.

First, the column address signal CA[1:0] indicating the semiconductor storage circuit A including a memory cell that is an object to be read is output. For example, when the memory cell to be read (hereinafter referred to as the third memory cell MC3) is included in the semiconductor storage circuit A on the left as viewed from the figure (hereinafter referred to as the semiconductor storage circuit A1), the column address signal CA[0] for the semiconductor storage circuit A1 is set to "L" and the column address signal CA[1] for the semiconductor storage circuit A on the right as viewed from the figure (hereinafter referred to as the semiconductor storage circuit A2) is set to "H."

Thereafter, in the semiconductor storage circuit A1, read operation of the memory cell group including the third memory cell MC3 is executed. For example, when the third memory cell MC3 is included in the first local block 1, read operation similar to the read operation of the first memory cell MC1 in the first embodiment is performed. Likewise, when the third memory cell MC3 is included in the second local block 2, read operation similar to the read operation of the second memory cell MC2 in the first embodiment is performed.

On the other hand, in the second storage circuit A2, data is read from a memory cell connected to the same read word line as the third memory cell MC3 in the semiconductor storage circuit A1 to the first or second local bit line LRBLA[1] or LRBLB[1]. For example, when the third memory cell MC3 is included in the first local block 1, data is read from the memory cell MC connected to the read word line RWLA[n] (n is an address of the third memory cell MC3 in the row direction, and an integer satisfying 0≤n≤x) to the first local bit line LRBLA[1]. Likewise, when the third memory cell MC3 is included in the second local block 2, for example, data is read from the memory cell MC connected to the read word line RWLB[n] to the second local bit line LRBLB[1]. However, since the column address signal CA[1] is "H," the output of the composite gate circuit 32 of the semiconductor storage circuit A2 does not change, whereby the output transistor N33 is not driven.

Thus, only the data from the semiconductor storage circuit A1 is read to the global bit line GRBL.

As described above, even when the semiconductor storage apparatus has a plurality of semiconductor storage circuits A connected to the common global bit line GRBL (FIG. 8 illustrates the case of two semiconductor storage circuits A1 and A2), the transistors P31 and P32 can be shared for the high-level latch operation of the first and second local bit lines LRBLA[1:0] and LRBLB[1:0] in each semiconductor storage circuit A. This can reduce the circuit area compared to the case of inserting one bit line keeper for each of the first and second local bit lines LRBLA[1:0] and LRBLB[1:0].

The number of semiconductor storage circuits A connected to the common global bit line GRBL is not limited to two as shown in FIG. 8, but three or more semiconductor storage circuits A may be connected. In this case, the number of bits of the column address signal CA[y:0] (y is an integer equal to or more than 2) may be increased, and semiconductor storage circuits A having a configuration similar to that described above (in the second embodiment) may be connected to the common global bit line GRBL and operated in a manner similar to that described above, whereby a similar advantage will be obtained.

Other Configuration Examples of Semiconductor Storage Circuit (Read Local Amplifier)

Figure 9:
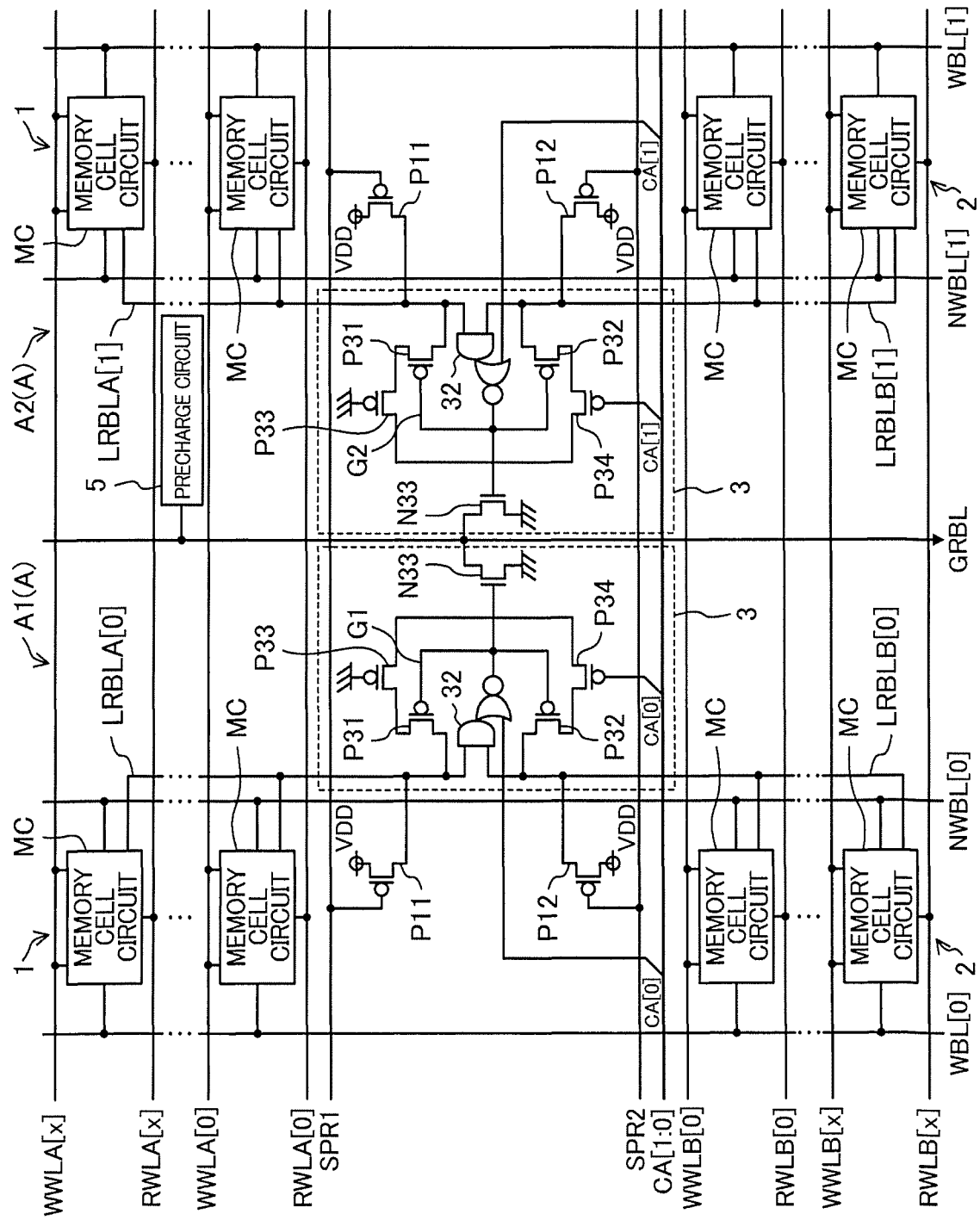
FIG. 9 is a view showing another example of the circuit configuration of the semiconductor storage circuit according to the second embodiment.

FIG. 9 is a view showing another configuration example of a main part of the semiconductor storage apparatus according to the second embodiment. Since the basic configuration is similar to that of FIG. 8, description will be made here focusing on different points from FIG. 8.

In each of the semiconductor storage circuits A1 and A2 in FIG. 9, the lead local amplifier 3 includes p-type transistors P33 and P34 as the second transistor serially connected between the transistors P31 and P32. The transistor P33 is connected to the ground VSS at its gate and thus is on at all times. To the gate of the transistor P34, the same column address signal CA[1:0] as that fed to the composite gate circuit 32 is fed. Specifically, the column address signal CA[0] is fed to the transistor P34 of the semiconductor storage circuit A1, and the column address signal CA[1] is fed to the transistor P34 of the semiconductor storage circuit A2.

Thus, in the semiconductor storage circuit A including a memory cell MC that is an object to be read, both the p-type transistors P33 and P34 are on. For example, when the memory cell to be read is included in the semiconductor storage circuit A1, the transistors P33 and P34 of the semiconductor storage circuit A1 have the function of reducing the driving capability of the circuit (transistors) in the first connection route PS1 (see FIG. 1) or the second connection route PS2 (see FIG. 4) as in the case of FIG. 6.

On the other hand, in the semiconductor storage circuit A that does not include the memory cell MC to be read (e.g., the semiconductor storage circuit A2), the p-type transistor P34 is turned off. Thus, in the semiconductor storage circuit A2, it is possible to prevent a current corresponding to the compensation current for achieving the function as the bit line keeper of the semiconductor storage circuit A1 from flowing in the semiconductor storage circuit A2 at the time of data read from the semiconductor storage circuit A1. Specifically, in FIG. 9, the semiconductor storage circuit A1 and the semiconductor storage circuit A2 control precharging using the common precharge signals SPR1 and SPR2 and also use the common read word line RWL. In the semiconductor storage circuit A2, therefore, at the time of data read from the semiconductor storage circuit A1, the transistors corresponding to the turned-on transistors in the semiconductor storage circuit A1 are also turned on. With this, as in the semiconductor storage circuit A1, the first or second precharge transistor P11 or P12 and the read access transistor N46 in the first or second connection route PS1 or PS2 related to the compensation current are turned on. In this situation, by turning off the transistor P34 of the semiconductor storage circuit A2 according to the column address signal CA[1], it is possible to prevent flow of an extra through current corresponding to the compensation current.

In FIG. 9, if the driving capability of the entire connection route PS1 or PS2 is sufficiently low with the transistors P31, P32, and P34 and the first or second precharge transistor P11 or P12, the transistor P33 can be omitted. Alternatively, the number of second transistors connected between the transistor P31 and the transistor P32 may be increased to three or more. Also, as in the first embodiment, in the semiconductor storage circuits A1 and A2, the positions of the transistors P33 and P34 are not limited to somewhere between the transistors P31 and P32. For example, the transistor P33 may be connected between the local bit line LRBLA[0] and the transistor P31, and the transistor P34 may be connected between the local bit line LRBLB[0] and the transistor P32.

The semiconductor storage circuits A described in the "Other Configuration Examples of Semiconductor Storage Circuit" in the first embodiment may be applied to this embodiment. For example, the semiconductor storage circuits A of FIGS. 5 to 7 may be applied in place of the semiconductor storage circuits A of FIG. 8. In these cases, also, a similar advantage will be obtained.

OTHER EMBODIMENTS

While the configuration in which the local bit line LRBL to which the memory cell MC to be read is connected goes to high impedance at the time of read of "H" data from the memory cell MC has been described in the above embodiments, the art related to the present disclosure may otherwise have a configuration in which the local bit line LRBL goes to high impedance at the time of read of "L" data. In this case, the polarity of the p-type transistors constituting the semiconductor storage circuit A, which is the first conductivity type, may be reversed to provide n-type transistors. Specifically, the first and second precharge transistors P11 and P12 may be replaced with n-type transistors, and the sources of the n-type transistors may be connected to the ground VSS in place of the power supply VDD. Also, the transistors P31 and P32 may be replaced with n-type transistors. In addition, in FIG. 6, the transistors P33 and P34 may be replaced with n-type transistors, and the gates of the replacing n-type transistors may be connected to the power supply VDD in place of the ground VSS. In FIGS. 1 and 4 to 7, the configuration of the gate circuit may be changed from the NAND circuit 31 to a 2-input NOR circuit with one input terminal connected to the first local bit line LRBLA[0] and the other input terminal connected to the second local bit line LRBLB[0]. Likewise, in FIGS. 8 and 9, the configuration of the gate circuit may be changed from the composite gate circuit 32 of 2-input AND and NOR to a composite gate circuit of 2-input OR and NAND. Also, the polarities of the precharge signals SPR1 and SPR2 and the column address signal CA[1:0] may be reversed. In FIG. 2, the polarity of the read drive transistor N45 and the read access transistor N46 may be reversed to the p type, the source of the read drive transistor N45 may be connected to the power supply VDD in place of the ground VSS, and the read word line RWL may be changed to perform "L" active operation.

Figure 10A:
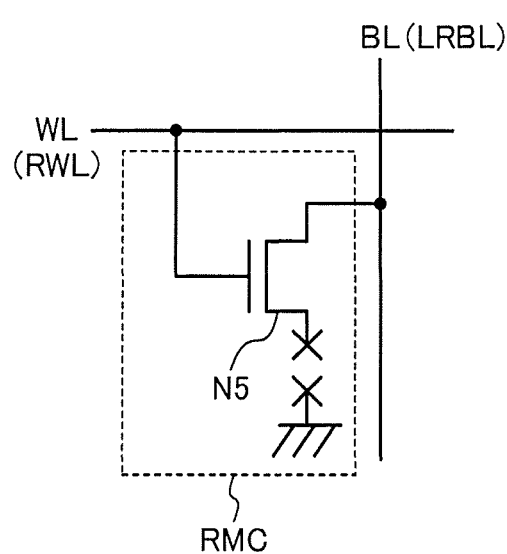
FIGS. 10A and 10B are views showing another example of the configuration of the memory cell.
Figure 10B:
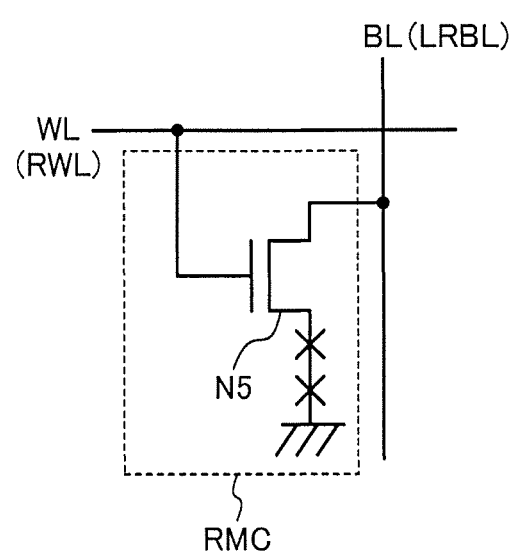

While the example of the memory cell MC being a dual port SRAM cell is shown in the above embodiments, the present disclosure is not limited to this. For example, the memory cell may be a ROM cell RMC. FIGS. 10A and 10B show a configuration example of the memory cell being a ROM cell, in which FIG. 10A shows a memory cell in which "H" data has been stored and FIG. 10B shows a memory cell in which "L" data has been stored. As shown in FIGS. 10A and 10B, a ROM cell RMC includes an n-type transistor N5 of which the gate is connected to a word line WL and the drain to a bit line BL. The source is floated in the memory cell storing "H" data or connected to the ground VSS in the memory cell storing "L" data. By placing the ROM cells RMC in place of the memory cells MC in FIG. 1 and connecting the bit lines BL to the first local bit line LRBLA [0] or the second local bit line LRBLB[0] and the word lines WL to the read word lines RWL, an operational advantage similar to that in the first embodiment can be obtained.

According to the present disclosure, a semiconductor storage circuit that has a hierarchical bit line structure and is provided with a function of a bit line keeper can be implemented with a reduced area. Thus, the present disclosure is useful for improvement of the performance of a semiconductor storage circuit and a semiconductor storage apparatus having such semiconductor storage circuits.

What is claimed is:

1. A semiconductor storage circuit, comprising:
a first local block including a plurality of first memory cells connected to a first local read bit line and a first precharge transistor of a first conductivity type connected between the first local read bit line and a first power supply;
a second local block including a plurality of second memory cells connected to a second local read bit line and a second precharge transistor of the first conductivity type connected between the second local read bit line and the first power supply;
a gate circuit configured to output a signal responsive to signals output to the first local read bit line and the second local read bit line;
an output circuit configured to output a signal responsive to the output of the gate circuit to a global read bit line; and
a first transistor of the first conductivity type provided between the first local read bit line and the second local read bit line, a gate of the first transistor being connected to the output of the gate circuit,
wherein
when the first precharge transistor is turned off and the first transistor is turned on, the first local read bit line is held at the level of the first power supply through only a conduction path formed of a series circuit of the second precharge transistor and the first transistor.

2. The semiconductor storage circuit of claim 1, wherein the first transistor is constituted by two serially-connected transistors of the first conductivity type, gates of the two transistors being connected to the output of the gate circuit.

3. The semiconductor storage circuit of claim 1, further comprising:
a second transistor of the first conductivity type provided between the first local read bit line and the second local read bit line and serially connected with the first transistor, wherein
a constant voltage that keeps the second transistor on at all times is fed to a gate of the second transistor.

4. The semiconductor storage circuit of claim 1, further comprising:

a second transistor of the first conductivity type provided between the first local read bit line and the second local read bit line and serially connected with the first transistor, wherein
a control signal that controls on/off of the second transistor is fed to a gate of the second transistor.

5. The semiconductor storage circuit of claim 1, wherein when the first local read bit line and/or the second local read bit line is in a first state, the gate circuit outputs a signal of a second state to the output circuit.

6. The semiconductor storage circuit of claim 5, wherein when the first local read bit line and the second local read bit line are at a first potential, the gate circuit outputs a second potential different from the first potential to the output circuit, and when the first local read bit line or the second local read bit line is at the second potential, the gate circuit outputs a signal of the first potential to the output circuit.

7. A semiconductor storage apparatus comprising:
a plurality of semiconductor storage circuits of claim 1 of which the output circuits are connected to a common global read bit line,
wherein
the gate circuit of each of the semiconductor storage circuits outputs a signal responsive to signals output to the first local read bit line and the second local read bit line and a column address signal.

8. The semiconductor storage apparatus of claim 7, further comprising:
a second transistor of the first conductivity type provided between the first local read bit line and the second local read bit line and serially connected with the first transistor, wherein
the column address signal is connected to a gate of the second transistor.

9. A data detection method of detecting data in a semiconductor storage circuit, comprising the steps of:
precharging first and second local read bit lines to each of which a plurality of memory cells are connected;
bringing a first transistor provided between the first local read bit line and the second local read bit line into conduction;
clearing the precharge of one local read bit line, out of the first local read bit line and the second local read bit line, to which a first memory cell that is an object to be read, among the plurality of memory cells, is connected;
holding the one local read bit line at a potential level of the precharge with only a conduction path from the other local read bit line through the first transistor, reading the state of the first memory cell to the one local read bit line, and shutting off the conduction of the first transistor according to the read state of the first memory cell; and
outputting a signal responsive to the read state of the first memory cell to a global read bit line.

10. The data detection method of claim 9, further comprising the steps of:
when the state of the first memory cell is read to the local read bit line of which the precharge has been cleared, driving an output of a gate circuit connected to the first and second local read bit lines to a predetermined logical level according to the read state of the first memory cell; and
shutting off the conduction of the first transistor according to the driving of the output of the gate circuit.

* * * * *